(12) United States Patent
Volkerink et al.

(10) Patent No.: US 7,590,903 B2
(45) Date of Patent: Sep. 15, 2009

(54) RE-CONFIGURABLE ARCHITECTURE FOR AUTOMATED TEST EQUIPMENT

(75) Inventors: Erik Volkerink, San Jose, CA (US); Hugh S. C. Wallace, Fort Collins, CO (US); Klaus-Dieter Hilliges, Shanghai (CN); Ajay Khoche, San Jose, CA (US); Jochen Rivoir, Magstadt (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 19 days.

(21) Appl. No.: 11/435,064

(22) Filed: May 15, 2006

(65) Prior Publication Data

US 2007/0266288 A1 Nov. 15, 2007

(51) Int. Cl.
*G01R 31/28* (2006.01)
*G11C 29/00* (2006.01)
*G06F 11/00* (2006.01)

(52) U.S. Cl. .................. 714/725; 714/718; 714/724; 714/738; 365/201

(58) Field of Classification Search .................. None
See application file for complete search history.

(56) References Cited

U.S. PATENT DOCUMENTS

| | | | | |
|---|---|---|---|---|
| 5,335,234 A | * | 8/1994 | Matteson et al. | 714/767 |
| 5,450,576 A | * | 9/1995 | Kennedy | 713/2 |
| 6,512,988 B1 | * | 1/2003 | Kanago | 702/123 |
| 6,851,076 B1 | * | 2/2005 | Cook et al. | 714/718 |
| 7,007,203 B2 | * | 2/2006 | Gorday et al. | 714/37 |
| 7,209,851 B2 | * | 4/2007 | Singh et al. | 702/119 |
| 7,228,472 B2 | * | 6/2007 | Johnson et al. | 714/724 |
| 7,340,357 B2 | * | 3/2008 | Ammerman et al. | 702/66 |
| 2002/0066049 A1 | * | 5/2002 | Garnett et al. | 714/5 |
| 2004/0225459 A1 | * | 11/2004 | Krishnaswamy et al. | 702/57 |
| 2005/0154551 A1 | * | 7/2005 | Pramanick et al. | 702/119 |
| 2006/0156102 A1 | * | 7/2006 | Johnson et al. | 714/724 |
| 2007/0038843 A1 | * | 2/2007 | Trivedi et al. | 712/34 |

* cited by examiner

*Primary Examiner*—John P Trimmings
*Assistant Examiner*—Guerrier Merant
(74) *Attorney, Agent, or Firm*—Holland & Hart, LLP

(57) ABSTRACT

An adaptive test system includes one or more reconfigurable test boards, with each test board including at least one re-configurable test processor. The re-configurable test processors can transmit communicate with one another using an inter-processor communications controller associated with each re-configurable test processor. The communications include configuration information, control information, communication protocols, stimulus data, and responses. Configuration information and stimulus data can also be read from a memory. Configuration information is used to configure one or more re-configurable test processors. Once configured, the re-configurable test processor or processors process the data in order to generate one or more test signals. The one or more test signals are then used to test a DUT.

17 Claims, 8 Drawing Sheets

RE-CONFIGURABLE ARCHITECTURE FOR AUTOMATED TEST EQUIPMENT

BACKGROUND

Designers of semiconductors, electronic circuits, and printed circuit boards increasingly use design-for-test (DFT) tools when testing products. Older test processes typically involved writing bits in predetermined patterns to test the products. But newer and advanced DFT techniques require faster and more complex protocols to communicate with automated test equipment.

FIG. 1 is a block diagram of automated test equipment in accordance with the prior art. Device-Under-Test (DUT) 100 is connected to several test boards 102, 104, 106. Test boards 102, 104, 106 communicate with workstation 108 via backplane 110. Although only three test boards are shown, automated test equipment can include any number of test boards.

Test boards 102, 104, 106 typically generate stimulus data designed to test DUT 100. Test boards 102, 104, 106 also receive responses from DUT 100. The responses are typically processed by individual test boards 102, 104, 106. When complex test algorithms are required, however, the responses are typically transmitted to workstation 108 for processing and analysis. For example, workstation 108 receives responses when re-calculation of stimulus data or execution of an ancillary or new test procedure is required.

FIG. 2 is a block diagram of a test board for use with automated test equipment according to the prior art. Test board 102 includes memory 200 and test processor 202. Test processor 202 includes stimulus path 204 and response path 206. Stimulus path 204 and response path 206 communicate with DUT 100 (FIG. 1) through pin electronics 208. Although only one memory 200, test processor 202, and pin electronics 208 are shown on test board 102, in practice test board 102 can include any number of these components. For example, a test board can include multiple test processors 202 for testing a single DUT or multiple DUTs.

Stimulus path 204 includes stimulus sequencer 210 and stimulus formatting 212 that transmit test signals to DUT 100. Response path 206 includes response data capture 214 and response and error processing 216 that receive response signals from DUT 100. Workstation 108 transfers data 222 from memory 200 when needed to test DUT 100. The response signals received from DUT 100 are then typically compared with expected response signals to determine the outcome of the test.

As discussed earlier, workstation 108 may generate new data for complex algorithms by reading data from memory 200 and storing new data 222 in memory 200. Controller 218 then obtains the new data from memory 200 and transfers or generates the necessary test data to stimulus path 204. Sending response data to workstation 108, having workstation 108 calculate new data and store the revised data in memory, and then reading the revised data from memory increases the time needed to test DUT 100. And increased test times reduce manufacturing throughput.

SUMMARY

In accordance with the invention, a re-configurable architecture for automated test equipment is provided. An adaptive test system includes one or more reconfigurable test boards, with each test board including at least one re-configurable test processor. The re-configurable test processors can communicate with one another using an inter-processor communications controller associated with each re-configurable test processor. The communications include configuration information, control information, communication protocols, stimulus data, and responses. Configuration information and stimulus data can also be read from a memory. Configuration information is used to configure one or more re-configurable test processors. Once configured, the re-configurable test processor or processors process the stimulus data in order to generate one or more test signals. The one or more test signals are then used to test a DUT.

DETAILED DESCRIPTION

Figure 1:
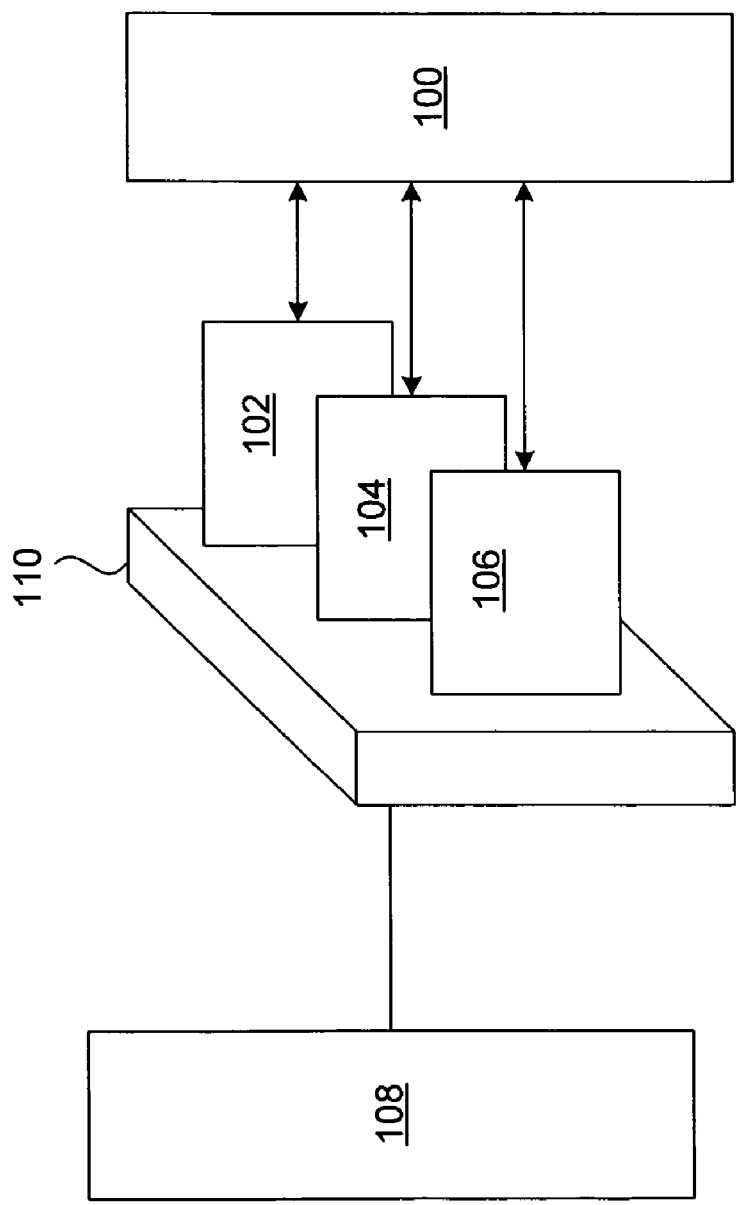
FIG. 1 is a block diagram of automated test equipment in accordance with the prior art.
Figure 2:
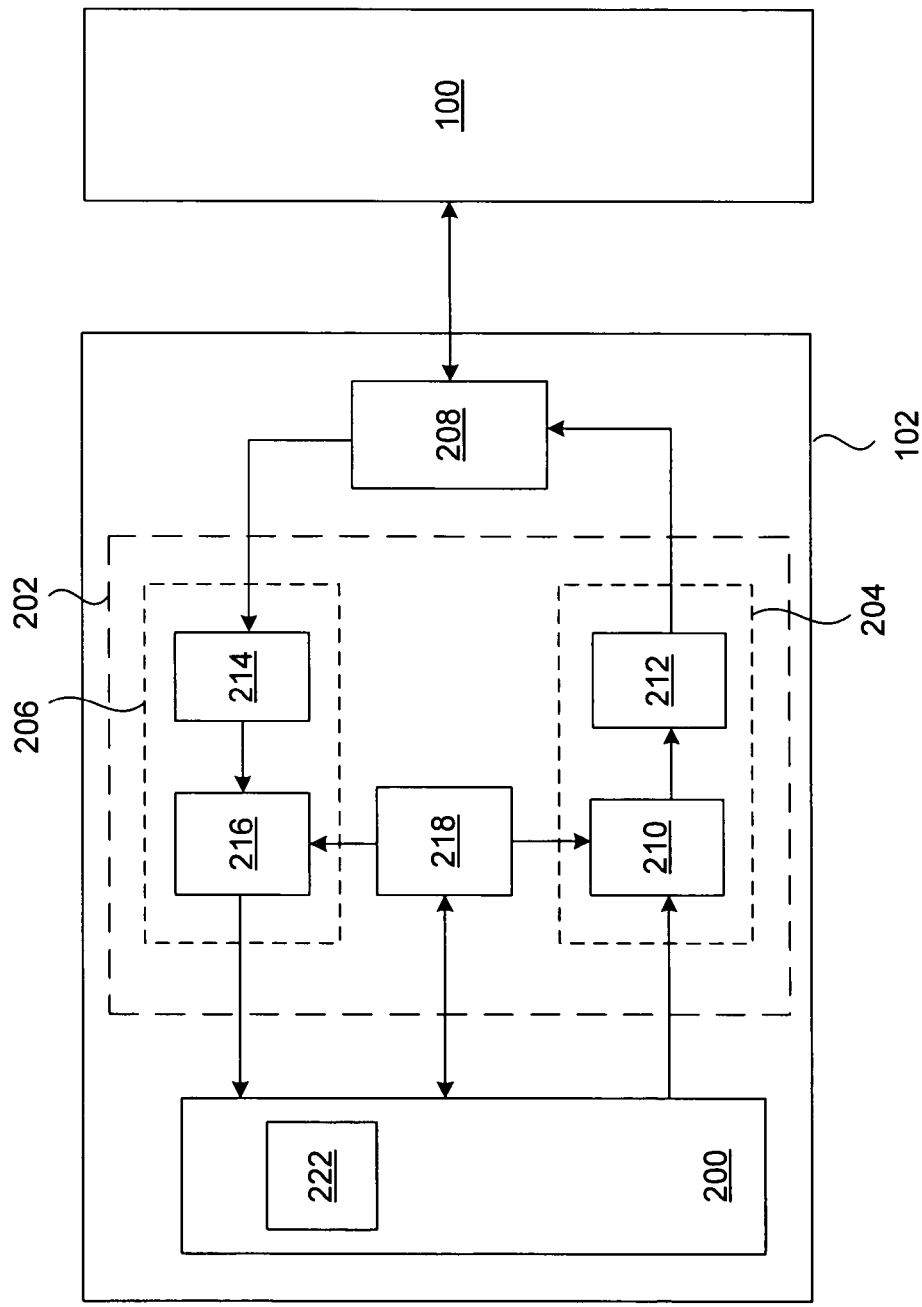
FIG. 2 is a block diagram of a test board for use with automated test equipment according to the prior art.

The following description is presented to enable embodiments of the invention to be made and used, and is provided in the context of a patent application and its requirements. Various modifications to the disclosed embodiments will be readily apparent, and the generic principles herein may be applied to other embodiments. Thus, the invention is not intended to be limited to the embodiments shown but is to be accorded the widest scope consistent with the appended claims. Like reference numerals designate corresponding parts throughout the figures.

Figure 3:
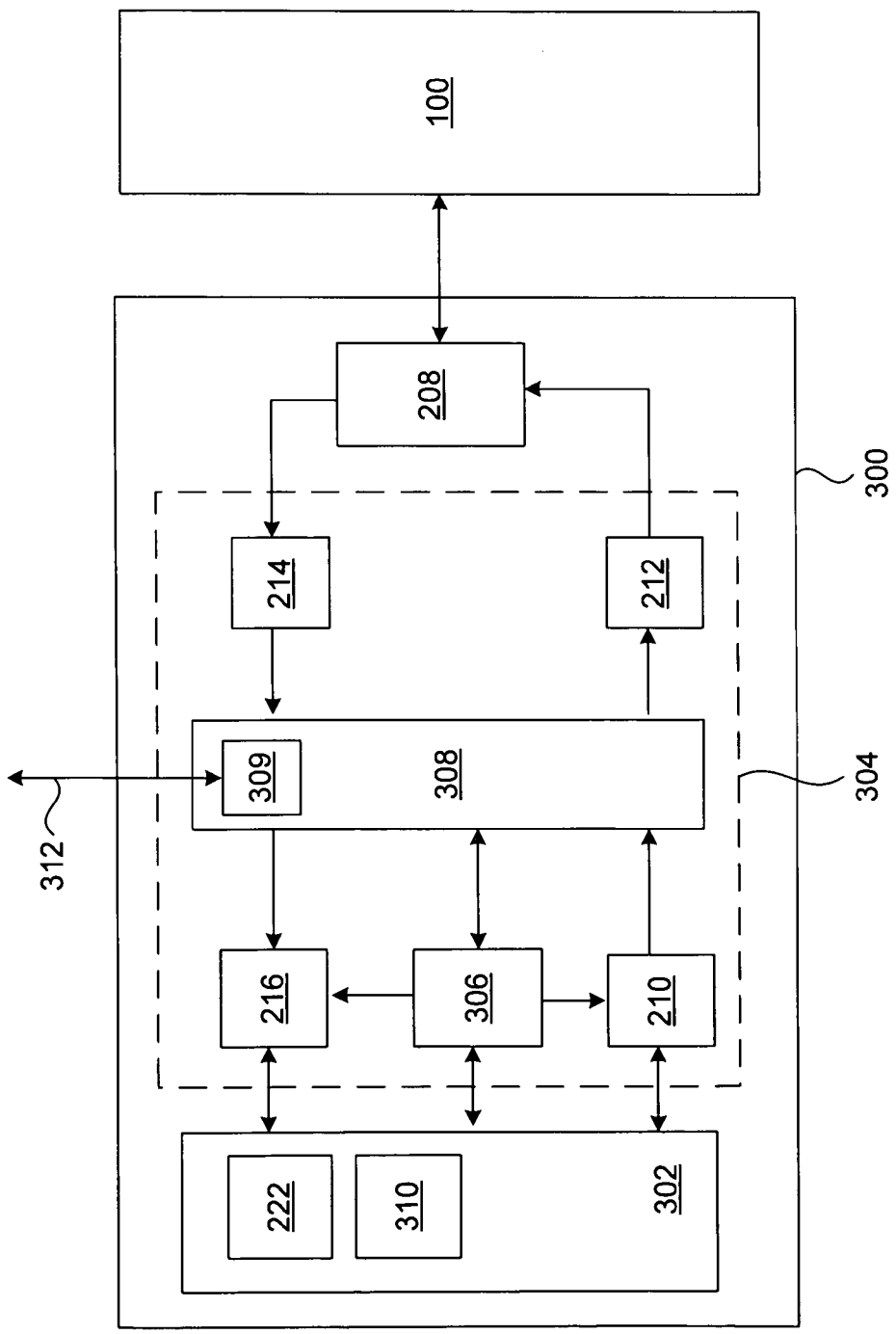
FIG. 3 is a block diagram of a test board for use with automated test equipment in an embodiment in accordance with the invention.

FIG. 3 is a block diagram of a test board for use with automated test equipment in an embodiment in accordance with the invention. Test board 300 includes memory 302, re-configurable test processor 304, and pin electronics 208. Although only one re-configurable test processor 304 is shown on test board 300, test board 300 may include any number of re-configurable test processors 304.

Re-configurable test processor 304 includes stimulus sequencer 210, stimulus formatting 212, response data capture 214, response and error processing 216, controller 306, re-configurable test component 308, and inter-processor communications controller 309. Stimulus sequencer 210, re-configurable test component 308 and stimulus formatting 212 are connected in series between memory 302 and pin electronics 208. Response data capture 214, re-configurable test component 308 and response and error processing 216 are also connected in series between pin electronics 208 and memory 302. Controller 306 is connected in series between memory 302 and re-configurable test component 308 and is additionally connected to stimulus sequencer 210 and response and error processing 216.

Stimulus data 222 used to test DUT 100 is read from memory 302 by controller 306. Stimulus data 222 includes, but is not limited to, test data, communications protocols, and control information. For example, stimulus data 222 is test data that includes test values such as numerals or symbols in an embodiment in accordance with the invention. Re-configurable test component 308 processes the test value or values in order to generate one or more test signals and transmits the test signals to DUT 100. DUT 100 generates one or more responses that are received by re-configurable test component 308. Based on the response or responses received from DUT 100, re-configurable test component 308 determines the next test value to use to test DUT 100.

In another embodiment in accordance with the invention, stimulus data 222 includes a communication protocol, such as, for example, PCI Express developed by the PCI-SIG® (Special Interest Group). Re-configurable test component 308 receives protocol data from DUT 100 and analyzes or decodes the protocol data. Based on the protocol data received from DUT 100, re-configurable test component 308 determines the next protocol data to transmit to DUT 100.

Controller 306 also reads configuration information 310 from memory 302 to configure re-configurable test component 308. Configuration information 310 includes test or sequencing instructions, control data, and topology data in an embodiment in accordance with the invention. For example, configuration information 310 includes low-level program and configuration data for a field programmable gate array (FPGA) in an embodiment in accordance with the invention. In other embodiments in accordance with the invention, configuration information 310 includes program and configuration data for a micro-coded central processing unit (CPU). The topology data is discussed in more detail in conjunction with FIG. 6.

Configuration information 310 is pre-stored in memory 302 in an embodiment in accordance with the invention. In another embodiment in accordance with the invention, configuration information is transmitted to re-configuration component 308 via communication channel 312 by another re-configurable test processor (not shown) located on test board 300 or another re-configurable test processor located on a different test board (not shown).

Inter-processor communications controller 309 transmits communications from re-configurable test component 308 and receives communications from another re-configurable test component (not shown) via communication channel 312. The communications between re-configurable test components include configuration information, control information, communication protocols, stimulus data, and responses. Inter-processor communications controller 309 configures re-configurable test component using configuration information received from communication channel 312 in an embodiment in accordance with the invention. In another embodiment in accordance with the invention, controller 306 accesses configuration information 310 in response to the information, stimulus data, or responses received from communication channel 312.

Figure 4:
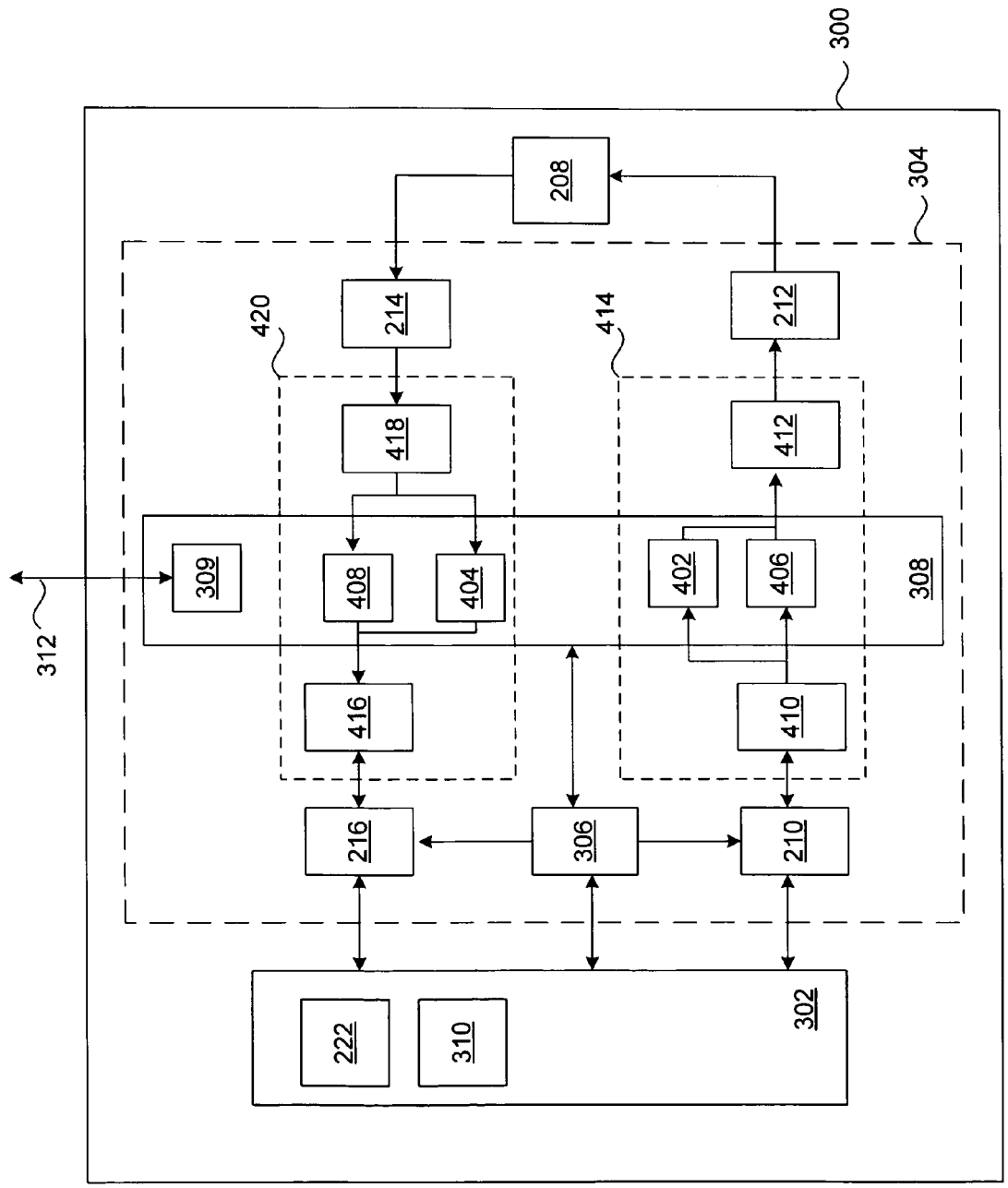
FIG. 4 is a more detailed block diagram the test board 300 shown in FIG. 3.

FIG. 4 is a more detailed block diagram of the test board 300 shown in FIG. 3. Re-configurable test component 308 includes re-configurable test circuits 406, 408 and bypass circuits 402, 404 connected in parallel, respectively. Re-configurable test circuits are implemented as field programmable gate arrays (FPGA), digital signal processor (DSP) circuits, or custom design cores in an embodiment in accordance with the invention.

The parallel combination of re-configurable test circuit 406 and bypass circuit 402 is connected in series with buffers 410, 412 to form re-configurable stimulus path 414. The parallel combination of re-configurable test circuit 408 and bypass circuit 404 is connected in series with buffers 416, 418 to form re-configurable response path 420. When bypass circuit 402 in re-configurable stimulus path 414 is enabled, stimulus data bypasses re-configurable test circuit 406 and are transmitted to stimulus formatting 212. The stimulus data may be stored in buffer 412 before it is received by stimulus formatting 212. When bypass circuit 404 in re-configurable response path 420 is enabled, responses from a DUT bypass re-configurable test circuit 408 and are transmitted to response and error processing 216. The responses may be stored in buffer 416 before receipt by response and error processing 212. Bypass circuits 402, 404 allow test board 300 to be compatible with other automated test equipment, such as, for example, older test equipment.

Bypass circuits 402, 404 may be enabled based on configuration information 310 read from memory 302 or configuration information received by inter-processor communications controller 309 from communication channel 312. Bypass circuits 402, 404 are gates or multiplexers in an embodiment in accordance with the invention. Although bypass circuits 402, 404 are shown implemented within re-configurable test processor 304, bypass circuits 402, 404 may be located outside of re-configurable test processor 304 in other embodiments in accordance with the invention.

As discussed above, inter-processor communications controller 309 controls communications between re-configurable test processors 304 on the same test board or on different test boards 300. Configuration information, control information, communication protocols, stimulus data, and responses may be received from and transmitted to other re-configurable test processors from communication channel 312. Controller 306 accesses configuration information 310 in response to the information, protocols, stimulus data, or responses received from communication channel 312 and re-configures one or both re-configurable test circuits 406, 408 in an embodiment in accordance with the invention. In another embodiment in accordance with the invention, inter-processor communications controller 309 causes the configuration information or data to be stored as configuration information 310 in memory 302.

Although inter-processor communications controller 309 is shown within re-configurable test processor 304, other embodiments in accordance with the invention are not limited to this implementation. Inter-processor communications controller 309 may be implemented outside of re-configurable test processor 304. Moreover, controller 306 and inter-processor communications controller 309 may be implemented as a single controller in other embodiments in accordance with the invention.

Buffers 410, 412, 416, 418 are each resizable buffers in an embodiment in accordance with the invention. Thus, in one embodiment in accordance with the invention, re-configurable test processor 304 does not include buffers 410, 412, 416, 418 as all of the buffers are sized to zero. In another embodiment in accordance with the invention, buffers 410, 418 are sized for storage space while buffers 412, 416 are not included in re-configurable test processor 304 (i.e., buffers 412, 418 are sized to zero). Other embodiments in accordance with the invention size buffers 410, 412, 416, 418 in any given manner. The size of any one buffer does not have to equal the size of any other buffer. One example of a buffer is a resizable first-in-first-out (FIFO) memory.

Figure 5:
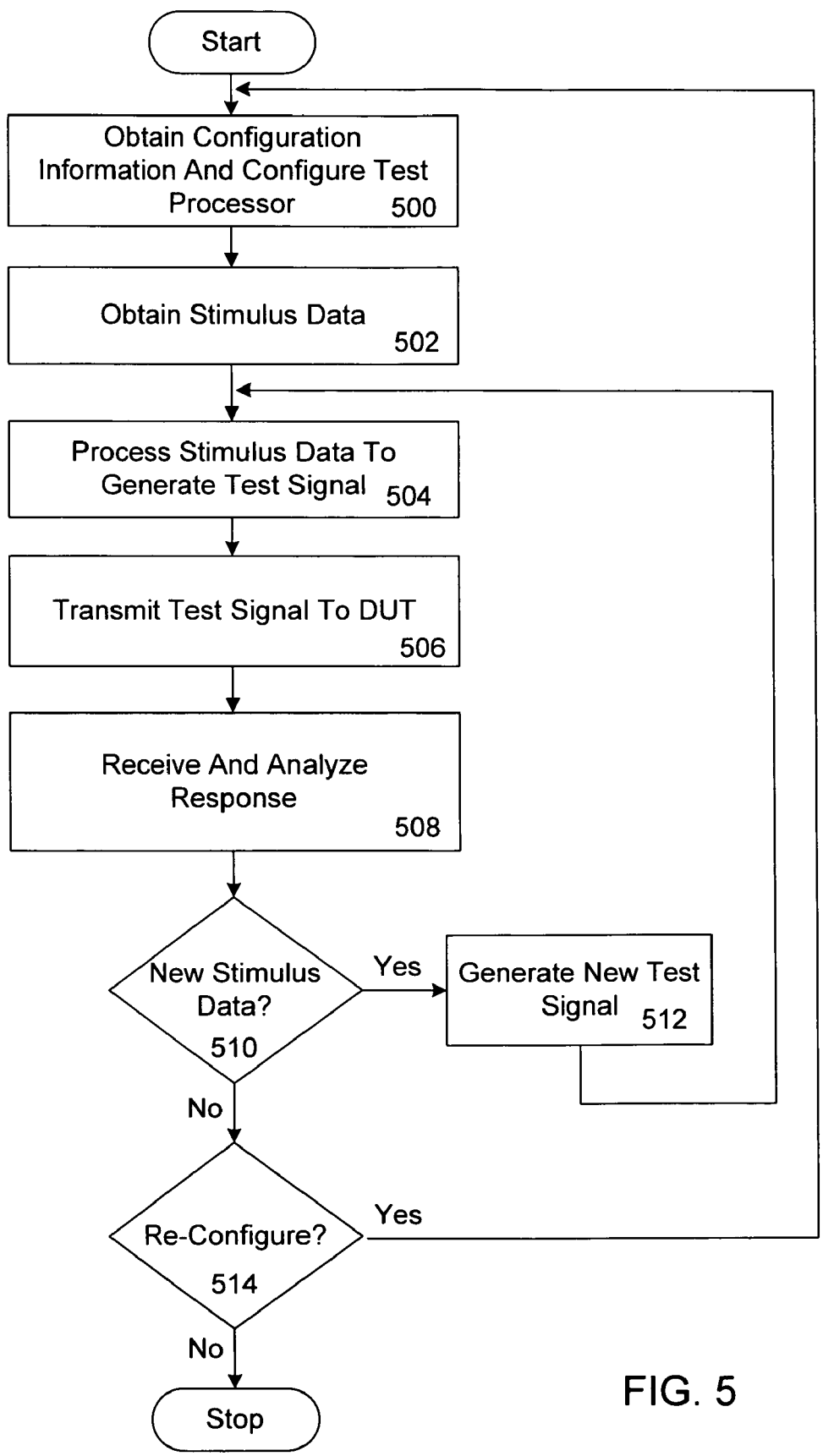
FIG. 5 is a flowchart of a method for testing a DUT using the re-configurable test processor 304 shown in FIG. 4.

FIG. 5 is a flowchart showing a method for testing a DUT using the re-configurable test processor 304 shown in FIG. 4. The applicable components in re-configurable test processor 304 that are used to perform the method are included in the description of FIG. 5. Initially configuration information is obtained and re-configurable test circuits 406, 408 are configured, as shown in block 500. The configuration information 310 is read from memory 302 in an embodiment in accordance with the invention. In another embodiment in accordance with the invention, the configuration information is transmitted to inter-processor communications controller 309 via communication channel 312 by another re-configurable test processor.

Stimulus data 222 are then obtained (block 502) and processed by re-configurable test circuit 406 to generate one or more test signals (block 504). As discussed earlier, stimulus data 222 includes, but is not limited to, test data, communications protocols, and control information. Stimulus data 222 are read from memory 302 in an embodiment in accordance with the invention. In another embodiment in accordance with the invention, the stimulus data 222 are transmitted to inter-processor communications controller 309 via communication channel 312 by another re-configurable test processor.

The test signal or signals are then transmitted to the DUT in order to test the DUT, as shown in block 506. The DUT generates a response that is then analyzed by re-configurable circuit 408 (block 508). Based on the response, re-configurable test circuit 408 determines at block 510 whether new stimulus data should be processed and a new test signal transmitted to the DUT. If so, the new test signal is generated at block 512 and the method returns to block 504. If new test signal is not to be generated, a determination is then made at block 514 as to whether one or both re-configurable test circuits 406, 408 are to be re-configured. If one or both re-configurable test circuits 406, 408 are to be re-configured, the method returns to block 500 and repeats until the DUT is tested.

Automated test equipment can use multiple test boards each with one or more re-configurable test processors to test a DUT. The test processors can work in series, in parallel, or in groups of re-configurable test processors that work in series or in parallel to provide test signals to the DUT, process the responses received from the DUT, and generate new test signals or test procedures. Collectively the test boards perform real-time or nearly real-time processing on responses and stimulus data. Thus, a single test may be performed by a single re-configurable test processor or by multiple re-configurable test processors on the same test board 300 or on different test boards 300. Additionally, responses may be analyzed by a single re-configurable test processor or by multiple re-configurable test processors, depending on the application.

Figure 6:
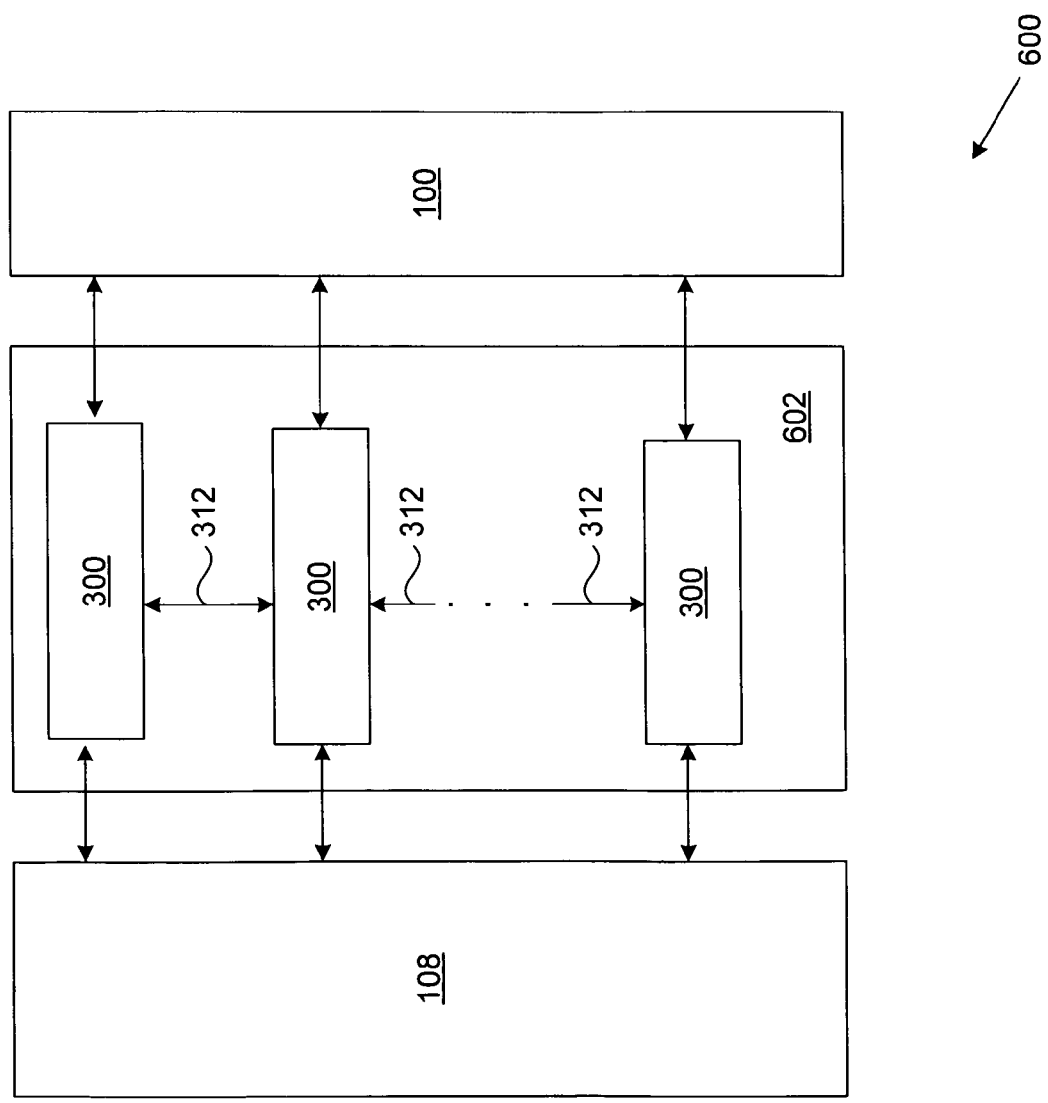
FIG. 6 is a block diagram of automated test equipment in an embodiment in accordance with the invention.

FIG. 6 is a block diagram of automated test equipment 600 in an embodiment in accordance with the invention. Test system 602 includes a number of test boards 300 each including one or more re-configurable test processors (not shown). The number of test boards 300 and the number of re-configurable test processors 304 on each board 300 depends on the application.

As discussed in conjunction with FIG. 4, re-configurable test processor 304 communicates with other re-configurable test processors on the same test board or on different test boards via inter-processor communications controller 309 and communication channel 312. Configuration information 310 read from memory 302 or received from communication channel 312 is used to configure the re-configurable test processors on a single test board or on multiple boards into a particular topology. The selected topology can result in re-configurable test processors working in series, in parallel, or in groups of test processors that work in series or in parallel to provide test signals to the DUT, process the responses received from the DUT, and generate new test signals or test procedures. Examples of different topologies include, but are not limited to, point-to-point, star, and ring configurations.

Figure 7:
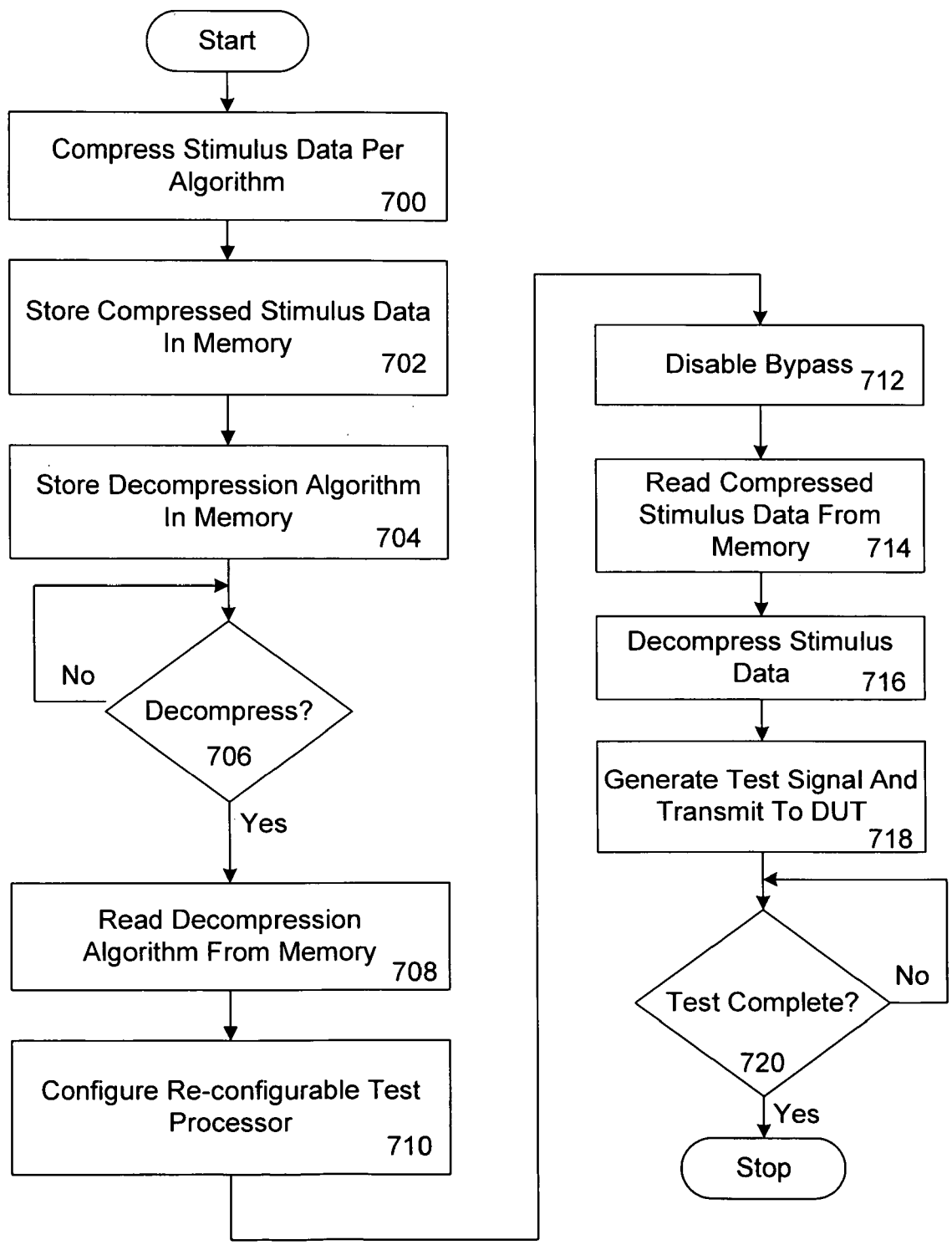
FIG. 7 illustrates a flowchart of a first test method performed by test board 300 shown in FIG. 3.
Figure 8:
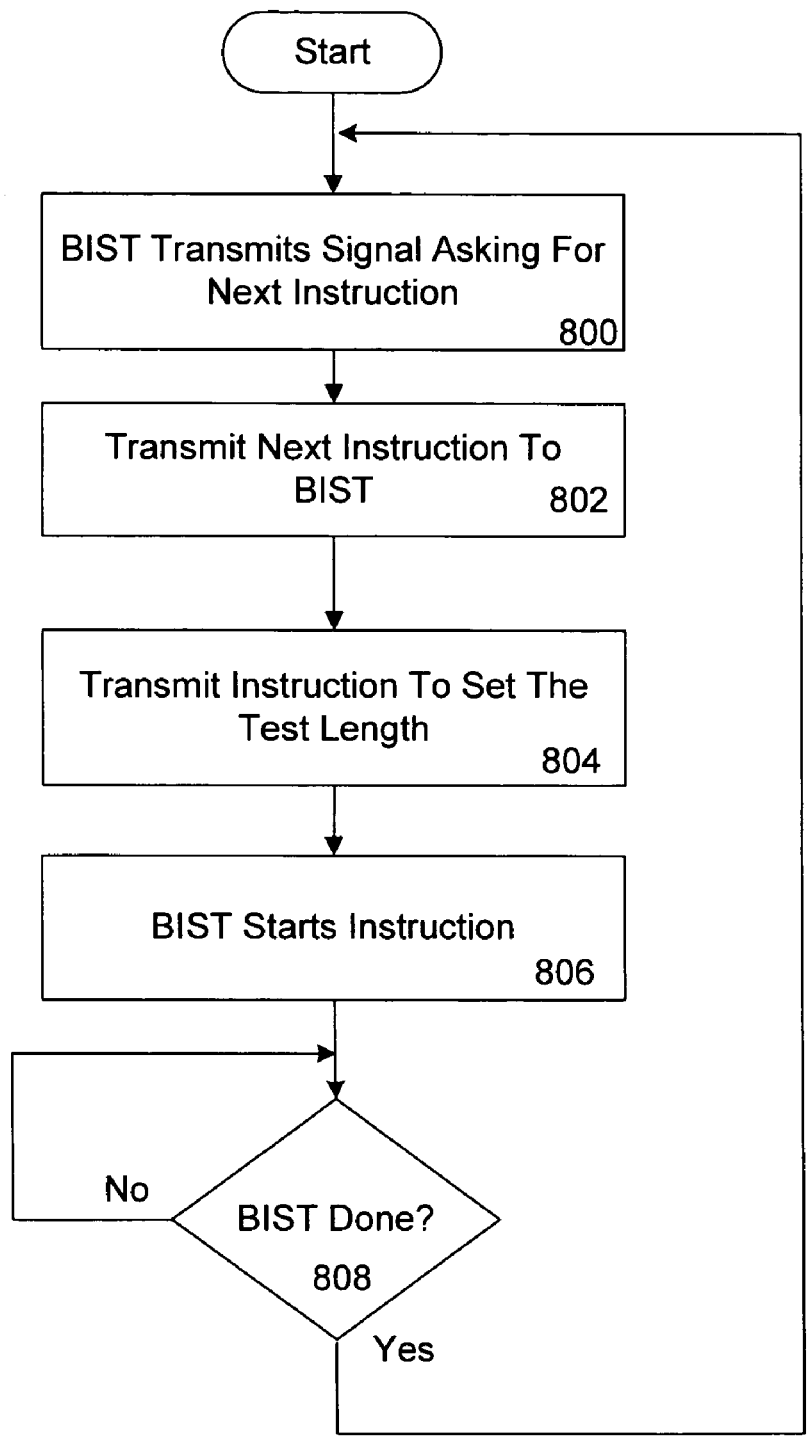
FIG. 8 illustrates a flowchart of a second test performed by test board 300 shown in FIG. 3.

Test boards with re-configurable test processors can be configured to perform a variety of different tests. FIGS. 7-8 are flowcharts depicting two tests that use one or more re-configurable test processors to test a DUT. The applicable components in re-configurable test processor 304 shown in FIG. 4 that are used to perform the tests are included in the description of FIGS. 7-8.

FIG. 7 shows a first test method that can be performed by test board 300 shown in FIG. 3. Blocks 700-714 illustrate processes that are performed prior to testing a DUT while blocks 716-720 are performed in real-time during the test process in an embodiment in accordance with the invention. Initially stimulus data that will be used to test a DUT are compressed pursuant to a given compression algorithm, as shown in block 700. The compressed stimulus data are then stored as stimulus data 222 in memory 302 (block 702). A decompression algorithm is also stored as configuration information 310 in memory 302, as shown in block 704.

A determination is then made at block 706 as to whether the compressed stimulus data are to be decompressed to test the DUT. If not, the method waits until the stimulus data are to be decompressed. When the compressed stimulus data are to be decompressed, the decompression algorithm is read from memory 302 (block 708) and controller 306 configures test circuit 406 to perform the decompression algorithm (block 710). Bypass circuit 402 is disabled in order to allow re-configurable test circuit 406 to decompress the data (block 712). The compressed stimulus data are read from memory 302 (block 714) and decompressed by re-configurable test circuit 406 (block 716).

Re-configurable test circuit 406 then processes the stimulus data in order to generate a test signal that is transmitted to the DUT, as shown in block 718. Next, at block 720 a determination is made as to whether the test is complete. If the test is not complete, the method waits until the test is complete.

A test board 300 with one or more re-configurable test processors 304 can perform decompression algorithms more flexibly than prior art test boards because the re-configurable test processor or processors can be re-configured to perform different decompression algorithms in real-time or near real-time. Prior art test boards were either custom designed test boards that performed only one specific decompression algorithm or were test boards that had to interact with a workstation in order to perform multiple decompression algorithms, thereby resulting in slower test times. Moreover, the re-configurable test processors 304 can be configured to perform more complex decompression algorithms since multiple re-configurable test processors on the same test board or on different test boards can be configured to execute the decompression algorithm or portions of the decompression algorithm simultaneously or successively.

FIG. 8 shows a second test that can be performed by test board 300 shown in FIG. 3. The method shown in FIG. 8 is used with a logic integrated circuit component with built-in-self test (BIST). The BIST communicates with an ATE using a communication protocol such as, for example, PCI Express. Initially the BIST transmits a signal to the ATE to request the next instruction (block 800). Next, at block 802, the ATE responsively sends an instruction to the BIST that defines the type of test to be performed. The ATE also sends an instruction to set the test length (block 804). The test length is the amount of data to be sent in an embodiment in accordance with the invention.

The BIST then executes the instruction and tests the integrated circuit component at block 806. Finally, a determination is made at block 808 as to whether the BIST has completed the instruction. If not, the process waits until the instruction is complete. Once the instruction is complete, the method returns to block 800 where the process repeats until all of the desired instructions have been performed and the testing of the integrated circuit component is complete.

FIG. 8 illustrates a test procedure that uses a more advanced communication protocol in conjunction with a re-configurable test board to test a DUT. Control of the test procedure is simple and one or more re-configurable test processors 304 can communication with other BISTs on additional integrated circuit components, thereby allowing the one or more re-configurable test processors 304 to test multiple integrated circuit components. This flexibility allows instructions to be sent to the other BISTs resulting in concurrent testing of the additional integrated circuit components.

As discussed earlier, the systems of FIGS. 3-4 and FIG. 6 are not limited in use to the applications shown in FIGS. 7-8. Test boards with one or more re-configurable test processors 304 may be used in a variety of applications. When a DUT is tested, the re-configurable test processors 304 may be configured for a variety of test procedures. The re-configurable test processors 304 generate stimulus data for computationally-intensive test procedures, analyze the responses on the test board, and generate new stimulus data in response to the responses without the intervention of a workstation.

The invention claimed is:

1. A re-configurable test board for use in automated test equipment, the test board comprising:
   memory operable to store configuration information and stimulus data;
   a first re-configurable test processor for processing the stimulus data and generating a test signal using a configuration of the first re-configurable test processor;
   a controller operable to read the configuration information from memory and configure the first re-configurable test processor using the configuration information read from memory; and
   an inter-processor communications controller associated with the first re-configurable test processor and operable to control communications between the first re-configurable test processor and at least one other re-configurable test processor, including a transmission of configuration information between the first re-configurable test processor the at least one other re-configurable test processor.

2. The re-configurable test board of claim 1, further comprising a second re-configurable test processor associated with the inter-processor communications controller, wherein the inter-processor communications controller controls communications between the first and second re-configurable test processors.

3. The re-configurable test board of claim 2, wherein the first and second re-configurable test processors each comprise a re-configurable test circuit.

4. The re-configurable test board of claim 1, wherein the configuration information comprises a decompression algorithm; wherein the stimulus data comprises compressed stimulus data; and wherein the controller configures the first re-configurable test processor to decompress the compressed stimulus data using the decompression algorithm.

5. The re-configurable test board of claim 1, wherein the first re-configurable test processor is one of: a field programmable gate array (FPGA) and a digital signal processor (DSP).

6. A re-configurable test board for use in automated test equipment, the test board comprising:
   memory operable to store configuration information;
   a first re-configurable test processor having i) a first re-configurable test circuit, and ii) a bypass circuit connected in parallel with the first re-configurable test circuit;
   a controller operable to read the configuration information from memory and configure the first re-configurable test processor using the configuration information read from memory;
   an inter-processor communications controller associated with the first re-configurable processor and operable to control communications between the first re-configurable test processor and at least one other re-configurable test processor, including a transmission of configuration information between the first re-configurable test processor the at least one other re-configurable test processor.

7. An adaptive test system for use in automated test equipment, the system comprising:
   two re-configurable test boards each comprising a re-configurable test processor;
   an inter-processor communications controller operable to control communications between one re-configurable test processor and the other re-configurable test processor, including a transmission of configuration information between the one re-configurable test processor and the other re-configurable test processor; and
   memory operable to store configuration information and stimulus data, wherein at least one of the re-configurable test processors is configurable based on the configuration information and is operable to test a Device Under Test (DUT) by processing the stimulus data using a configuration thereof, to generate a test signal.

8. The adaptive test system of claim 7, wherein each re-configurable test processor comprises a re-configurable test circuit.

9. The adaptive test system of claim 8, wherein each re-configurable test processor additionally comprises a bypass circuit connected in parallel with a respective re-configurable test circuit.

10. A method for testing a Device Under Test (DUT) using a re-configurable test processor on a re-configurable test board for use in automated test equipment, the method comprising:
    obtaining configuration information;
    configuring the re-configurable test processor in response to the configuration information;
    obtaining stimulus data for the configuration of the re-configurable test processor;
    processing the stimulus data using the configuration of the re-configurable test processor, to generate a test signal;
    transmitting the test signal to the DUT;
    receiving a response to the test signal from the DUT;
    obtaining additional configuration information in response to the response;
    changing the configuration of the re-configurable test processor in response to the additional configuration information;
    obtaining stimulus data for the additional configuration of the re-configurable test processor;
    processing the stimulus data to generate a new test signal; and
    transmitting the new test signal to the DUT.

11. The method of claim 10, wherein the obtaining configuration information comprises reading stored configuration information.

12. The method of claim 10, wherein the obtaining configuration information comprises receiving configuration information from another re-configurable test processor.

13. The method of claim 12, wherein the obtaining stimulus data comprises receiving the stimulus data for the configuration from another re-configurable test processor.

14. The method of claim 10, further comprising configuring the re-configurable test processor to receive and analyze the response from the DUT.

15. The method of claim 10, wherein obtaining additional configuration information comprises reading stored additional configuration information.

16. The method of claim 10, wherein obtaining additional configuration information comprises receiving additional configuration information transmitted from an additional re-configurable test processor.

17. The method of claim 10, wherein the configuration information comprises a decompression algorithm; wherein the stimulus data comprises compressed stimulus data; and wherein the stimulus data is processed, using the configuration of the re-configurable test processor, to decompress the compressed stimulus data using the decompression algorithm.

* * * * *

UNITED STATES PATENT AND TRADEMARK OFFICE
CERTIFICATE OF CORRECTION

| | | |
|---|---|---|
| PATENT NO. | : 7,590,903 B2 | Page 1 of 1 |
| APPLICATION NO. | : 11/435064 | |
| DATED | : September 15, 2009 | |
| INVENTOR(S) | : Erik Volkerink et al. | |

It is certified that error appears in the above-identified patent and that said Letters Patent is hereby corrected as shown below:

Column 7, line 45, "processor the" should read --processor and the--.

Column 8, line 16, "processor the" should read --processor and the--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,590,903 B2
APPLICATION NO. : 11/435064
DATED : September 15, 2009
INVENTOR(S) : Volkerink et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 45 days.

Signed and Sealed this

Fourteenth Day of December, 2010

David J. Kappos
*Director of the United States Patent and Trademark Office*